United States Patent

Ando et al.

Patent Number: 5,316,631
Date of Patent: May 31, 1994

[54] METHOD FOR FABRICATING A MAGNETIC RECORDING MEDIUM

[75] Inventors: Toshio Ando, Fujisawa; Toshikazu Nishihara, Zama, both of Japan

[73] Assignee: Victor Company of Japan, Ltd., Yokohama, Japan

[21] Appl. No.: 927,715

[22] Filed: Aug. 11, 1992

Related U.S. Application Data

[63] Continuation of Ser. No. 480,446, Feb. 15, 1990, abandoned.

[30] Foreign Application Priority Data

Feb. 16, 1989 [JP] Japan .................. 1-35070
Feb. 28, 1989 [JP] Japan .................. 1-47880

[51] Int. Cl.$^5$ .............................. C23C 14/34
[52] U.S. Cl. .................. 204/192.2; 428/611; 428/678; 428/694 TS
[58] Field of Search .......... 428/611, 678, 694, 900, 428/928, 634 TS; 204/192.2, 192.1

[56] References Cited

U.S. PATENT DOCUMENTS

| | | | |
|---|---|---|---|
| 4,548,871 | 10/1985 | Kobayashi et al. | 428/611 |
| 4,661,418 | 4/1987 | Vanai et al. | 428/611 |
| 4,711,810 | 12/1987 | Ando et al. | 428/694 |
| 4,743,348 | 5/1988 | Ando et al. | 428/900 |
| 4,900,397 | 2/1990 | Wenner et al. | 428/611 |
| 4,987,039 | 1/1991 | Daimon et al. | 428/611 |
| 5,066,552 | 11/1991 | Howard et al. | 428/694 |

FOREIGN PATENT DOCUMENTS

| | | |
|---|---|---|
| 59-58804 | 4/1984 | Japan . |
| 59-61105 | 4/1984 | Japan . |
| 60-83218 | 5/1985 | Japan . |
| 61-105721 | 5/1986 | Japan . |
| 61-115244 | 6/1986 | Japan . |
| 1379360 | 1/1975 | United Kingdom . |

Primary Examiner—Paul J. Thibodeau
Assistant Examiner—Leszek Kiliman
Attorney, Agent, or Firm—Lowe, Price, LeBlanc & Becker

[57] ABSTRACT

A magnetic recording medium which comprises, on a substrate, a Cr undercoat layer and a Co alloy thin film formed on the substrate in this order. The coercive force of the medium is significantly improved by incorporating oxygen either in the Cr undercoat layer or in the Co alloy thin film.

2 Claims, 4 Drawing Sheets

METHOD FOR FABRICATING A MAGNETIC RECORDING MEDIUM

This application is a continuation application of application Ser. No. 07/480,446, filed Feb. 15, 1990, now abandoned.

BACKGROUND OF THE INVENTION

1. Field of the Invention

This invention relates to magnetic recording mediums which are suitable for horizontal magnetization recording and which have a Cr undercoat layer and a magnetic Co alloy layer formed on the undercoat layer. The invention also relates to a method for making such mediums.

2. Description of the Prior Art

In recent years, those magnetic recording mediums for high density recording using a magnetic Co alloy film have been often employed. In particular, rigid or hard disks making use of a Cr undercoat layer and a magnetic Co alloy layer formed on the undercoat layer have been studied in order to increase the coercive force, Hc. To this end, a variety of elements have been added to the Cr undercoat layer. For instance, when elements such as Gd, Ce, Cu, Si, etc., are incorporated in the Cr undercoat layer in an amount of about 1 atomic percent, the coercive force is increased by about 100 to 200 Oe as compared with the case where no additive element is added. Over 1 atomic percent, the coercive force, Hc, tends to decrease ("Effects of Substituted Elements into the Cr Layer on CoNiCr/Cr Sputtered Hard Disk" in Reports of the 12th Meeting of the Japan Applied Magnetic Society).

However, the increase of the coercive force by approximately 100 to 200 Oe is not satisfactory for use as high density magnetic recording mediums. Moreover, it is very difficult to appropriately control the amount of the additive element at about 1 atomic percent.

Another type of high density magnetic recording medium of the horizontal magnetization type has been proposed wherein a Co alloy film or layer is incorporated with a certain amount of oxygen to improve magnetic characteristics and a corrosion resistance. For example, CoCr alloys are subjected to vapor deposition under an oxygen pressure of 1 to 3 mTorr., thereby forming an amorphous CoCr alloy film containing from 5 to 15 atomic percent of oxygen therein. This type of medium is described, for example, in Japanese Laid-open Patent Application Nos. 61-115244 and 61-105721 and U.S. Pat. No. 4,711,810. Moreover, a magnetic layer composed of Co, Ni and O with or without use of Cr is formed by oblique vapor deposition techniques while controlling the content of oxygen, thereby improving magnetic characteristics and a corrosion resistance (Japanese Laid-open Patent Application Nos. 59-58804 and 59-61105.

However, the CoCr alloy film is amorphous in nature and has thus no magnetic anisotropy, so that the maximum coercive force is in the range of from 500 to 600 Oe. This is not satisfactory for use as a medium for high density recording. In addition, the oblique vapor deposition is disadvantageous in that much of the starting material is consumed in vain.

SUMMARY OF THE INVENTION

It is accordingly an object of the invention to provide a magnetic recording medium of the horizontal magnetization type which has a significantly improved coercive force and is adapted for use in high density recording.

It is another object of the invention to provide a magnetic recording medium of the type which comprises a Cr undercoat layer and a magnetic Co alloy layer formed on the undercoat layer wherein a predetermined amount of oxygen is incorporated in the undercoat layer or the Co alloy layer whereby the coercive force is improved.

It is a further object of the invention to provide a method for fabricating such a medium as mentioned above.

According to one embodiment of the invention, there is provided a magnetic recording medium which comprises a Cr undercoat layer and a magnetic Co alloy thin film formed on a substrate in this order. The Cr undercoat layer contains from 4 to 50 atomic percent of oxygen therein. This magnetic recording medium can be fabricated by a sputtering technique which comprises forming a Cr undercoat layer on a substrate and further forming a Co alloy thin film on the undercoat layer by sputtering, wherein the undercoat layer is formed by sputtering in an atmosphere of a mixed gas of argon and oxygen at a total pressure of from 10 to 20 mTorr. and at a partial pressure of oxygen of from 1 to 20% based on the total pressure whereby from 4 to 50 atomic percent of the oxygen is incorporated in the undercoat layer.

According to another embodiment of the invention, there is also provided a magnetic recording medium which comprises a Cr undercoat layer and a magnetic Co alloy thin film formed on a substrate in this order, the Co alloy thin film having from 15 to 30 atomic percent of oxygen incorporated therein. The magnetic recording medium is fabricated by a method wherein the Cr undercoat layer is first formed by sputtering on the substrate and then forming the Co alloy thin film by sputtering in an atmosphere of a mixed gas of argon and oxygen at a total pressure of from 5 to 20 mTorr. and at a partial pressure of oxygen of from 4.2 to 6.5% based on the total pressure whereby the thin film has from 15 to 30 atomic percent of oxygen therein.

DETAILED DESCRIPTION AND EMBODIMENTS OF THE INVENTION

Figure 1:
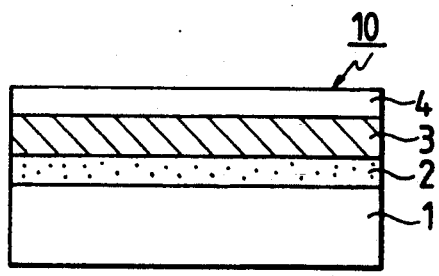
FIG. 1 is a schematic side view of a magnetic recording medium according to the invention.

The first embodiment is described with reference to the accompanying drawings and particularly, to FIG. 1. In the figure, there is generally shown a magnetic recording medium 10 including a substrate 1 such as, for example, of glass or Al plated with NiP ordinarily used for hard disks. The medium 10 has on the substrate 1 a Cr undercoat layer 2 containing from 4 to 50 atomic percent, preferably from 10 to 30 atomic percent, of oxygen. The undercoat layer 2 has generally a thickness of from 0.03 to 0.5 micrometers. The medium 10 further includes a magnetic thin film 3 made of a Co alloy and formed on the undercoat layer 2. This thin film is usually in a thickness range of from 0.03 to 0.2 micrometers. The Co alloys useful in the present invention may be CoPt, CoNi, CoCr, CoNiCr, CoCrTa and the like wherein a major proportion of Co is used. The content of Co in these alloys should preferably be not less than 60 atomic percent in view of magnetic characteristics of the final medium. Of these, CoPt and CoCrTa alloys are preferably used.

If necessary, the medium has a protective layer 4 formed on the magnetic thin film 3. Such a protective layer 4 is made, for example, of carbon.

This embodiment of the invention is characterized in that as defined above, the Cr undercoat layer should contain from 4 to 50 atomic percent of oxygen. The resultant magnetic recording medium has a greater coercive force, Hc, by 200 to 800 Oe than known mediums which have a Cr undercoat layer free of oxygen.

It is known that with a magnetic layer which is crystalline in nature, the coercive force, Hc, can be increased by causing particles to come close to single magnetic domain particles. If the crystal particles of the Cr undercoat layer are made finer and a magnetic crystalline layer is formed on the undercoat layer, the magnetic layer is formed as having fine crystal particles. As a result, a final magnetic recording medium is imparted with high coercive force. It will be noted that the undercoat layer and the magnetic film used in the present invention are both crystalline, not amorphous in nature.

The present invention is based on the following finding. The crystals of Cr have a bcc structure. When no oxygen is contained, Cr is formed as a layer which is well crystallized and is made of large-size crystal particles. However, when oxygen is incorporated in the layer, the crystal particles of Cr become fine and come closer to single magnetic domain particles. Eventually, the crystal particles of a magnetic crystalline layer formed on the Cr layer of the fine crystal particles also become fine, leading to an increase of the coercive force, Hc.

Figure 2A:
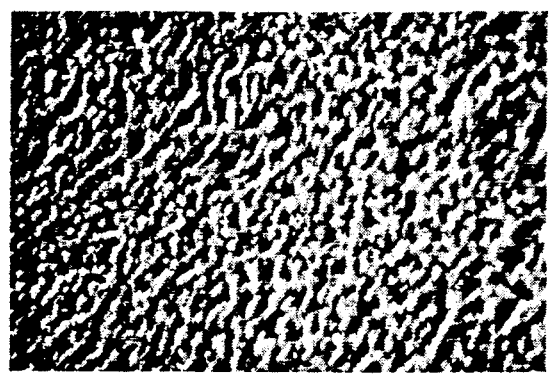
FIGS. 2a to 2c are, respectively, electron microphotographs showing grain structures on the surfaces of CoPt/CrO films which are formed under different partial pressures of oxygen during Cr sputtering.
Figure 2B:
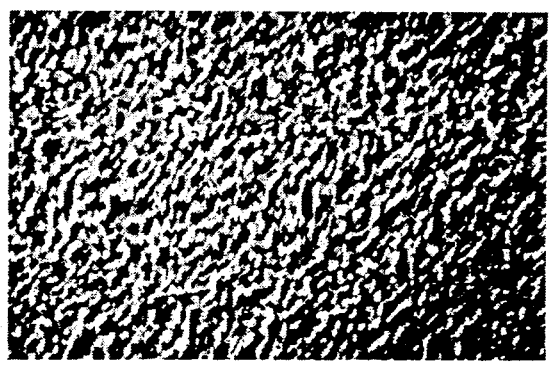
Figure 2C:
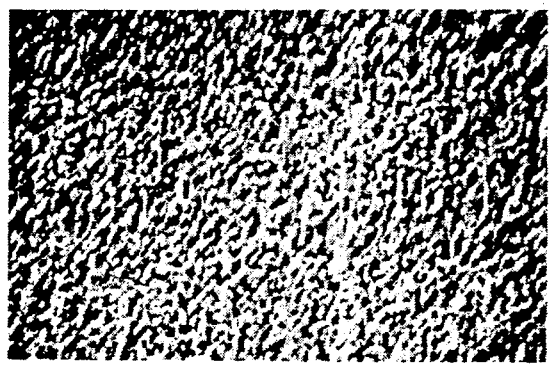

FIGS. 2a to 2c, there are shown photographs obtained through a scanning electron microscope of particle structures on the surfaces of CoPt films formed on a CrO film at different oxygen contents in an atmosphere of argon at the time of Cr sputtering. More particularly, FIG. 2a is the structure using no oxygen in the atmosphere, FIG. 2b is the structure at the oxygen content of 19 atomic percent, and FIG. 2c is a particle structure at the oxygen content of 43 atomic percent. From these figures, it will be seen that the crystal particles of CoPt become finer at a larger content of oxygen.

Thus, it has been confirmed that the incorporation of oxygen enables one to obtain fine crystal particles.

The magnetic recording medium comprising a Cr undercoat layer having oxygen incorporated therein can be fabricated by sputtering Cr in an atmosphere containing oxygen and argon. This is particularly described.

Cr and CoPt having a Pt content of 10 atomic percent are successively subjected to DC magnetron sputtering on a glass substrate to form a 0.2 μm thick Cr film and a 0.05 μm thick CoPt film on the substrate under different sputtering conditions. The sputtering conditions are shown in Table 1.

TABLE 1

| Film Material | Cr | CoPt |
|---|---|---|
| atmospheric gas | Ar + O$_2$ | Ar |
| mTorr | 20 | 20 |
| substrate temperature | room temp. | room temp. |
| charged power density (W/cm$^2$) | 4 | 1 |
| distance between target and glass substrate (mm) | 86 | 80 |

Thereafter, a carbon protective film is formed on the magnetic film.

Figure 3:
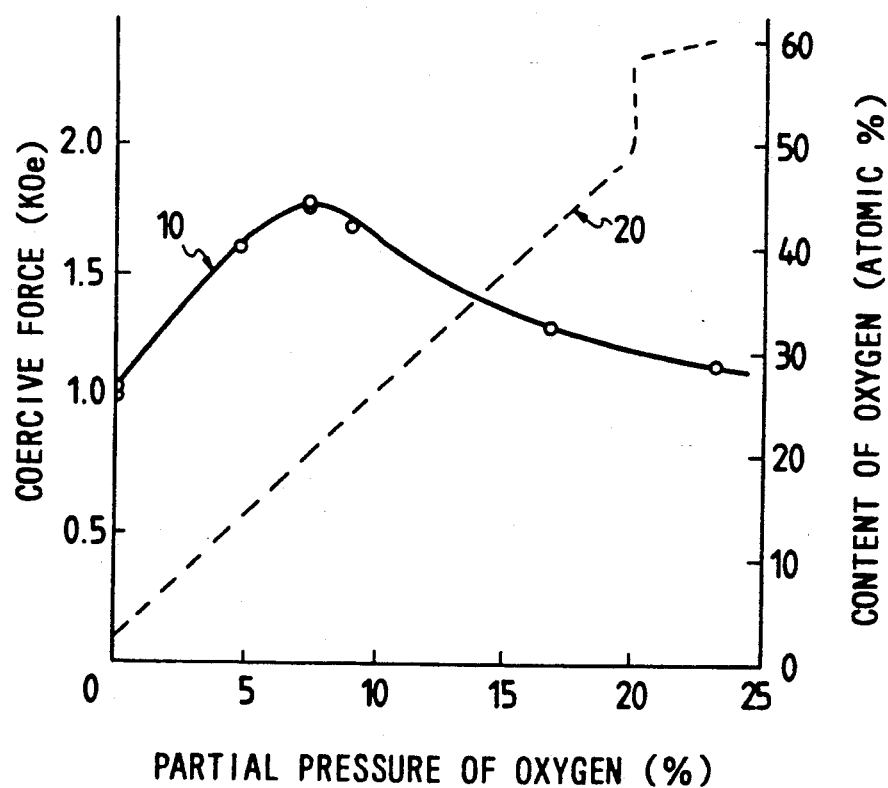
FIG. 3 is a graphical representation of the coercive force, Hc, and the content of oxygen in a Cr film in relation to the variation in the partial pressure of oxygen in the atmosphere for sputtering.

While changing the content of oxygen in the atmospheric gas, a number of the magnetic recording mediums are fabricated and subjected to measurements of the content of oxygen in the Cr undercoat layer and the coercive force. The results are shown in FIG. 3. In the figure, the solid line indicates the coercive force, Hc, in relation to the variation in the partial pressure of oxygen in the sputtering atmosphere and the dotted line indicates the content of oxygen in the Cr undercoat layer in relation to the same variation as set out above.

From the figure, it will be appreciated that when no oxygen is used in the atmosphere and incorporated in the undercoat layer, the coercive force is approximately 1000 Oe.

When the partial pressure of oxygen in the mixed gas atmosphere of argon and oxygen is in the range of from 1 to 20% based on the total pressure, the oxygen content in the Cr undercoat layer is linearly increased to from 4 to 50 atomic percent.

The coercive force is found to be 1200 Oe when the undercoat layer is formed at a partial pressure of oxygen of approximately 1% or the content of oxygen in the layer is approximately 4 atomic percent. At a partial oxygen pressure of approximately 7.5% (corresponding to an oxygen content in the layer of approximately 20 atomic percent), the coercive force reaches about 1800 Oe, which is higher by 800 Oe than that of the medium using the oxygen-free undercoat layer. At a partial oxygen pressure over 7.5%, the coercive force gradually decreases and is maintained at approximately 1200 Oe until the partial oxygen pressure reaches 20% (corresponding to an oxygen content of 50 atomic percent). This is the reason why the partial oxygen pressure is defined to be in the range of from 1 to 20% or the content of oxygen in the layer is in the range of from 4 to 50 atomic percent, within which the coercive force is not less than 1200 Oe. The figure shows that a preferable partial pressure range is from 5 to 10% or a preferable oxygen content is from 10 to 30 atomic percent.

Although the CoPt magnetic layer has been illustrated as having 10 atomic percent of Pt, the coercive force may be further increased when the content of Pt is increased. The content of Co should preferably be up to 60 atomic percent. Once again, other Co alloys including CoNi, CoCr, CoNiCr, CoCrTa and the like may likewise be used.

For the formation of the undercoat layer, the sputtering conditions other than the partial pressure of oxygen are not critical. Preferably, the substrate temperature is from room temperature to 300° C. and the power density is from 0.2 to 20 W/cm$^2$, which depend on the distance between the target and the substrate. Likewise, the sputtering conditions for the magnetic layer should preferably include a substrate temperature of from room temperature to 300° C. and a power density of from 0.2 to 20 W/cm$^2$.

Another embodiment of the invention is then described. In this embodiment, the magnetic recording medium comprises on a substrate a Cr undercoat layer and a magnetic Co alloy thin film. The Co alloy thin film is the same as that described with respect to the first embodiment but is incorporated with from 15 to 30 atomic percent of oxygen. The fundamental arrangement of the magnetic recording medium according to this embodiment is as shown in FIG. 1. By the incorporation of 15 to 30 atomic percent of oxygen in the magnetic thin film, the coercive force becomes higher by 400 to 1500 Oe than that of a medium using an oxygen-free magnetic thin film of Co alloy.

It is known that in a magnetic recording medium having a Cr undercoat layer and a sputtered Co alloy thin film for horizontal or in-plane magnetization recording, the crystal lattices of the Cr undercoat layer and the Co alloy thin film are matched with each other so that the C axis of the Co alloy is along the in-plane direction. As a result, a large magnetic anisotropy generates along the in-plane direction, ensuring good magnetic characteristics.

It has been found that when crystals of a Co alloy are caused to grow on crystal particles of Cr while incorporating oxygen, segregation of the alloy composition takes place in such a way that crystal particles grow while permitting oxygen to fold or cover the particles. As a consequence, one particle takes a single magnetic domain structure which is magnetically isolated from other particles. Accordingly, the coercive force of the alloy film has been confirmed to drastically increase.

The method for fabricating the magnetic recording medium according to this embodiment of the invention is described.

A Cr undercoat layer and a magnetic thin film of a CoPt alloy having 10 atomic percent of Pt are formed on a glass substrate by DC magnetron sputtering to form a 0.25 μm thick metallic film consisting of a 0.2 μm thick Cr film and a 0.05 μm thick CoPt film. The following sputtering conditions are used.

TABLE 2

| Film Material | Cr | CoPt |
|---|---|---|
| atmospheric gas | Ar | Ar + O$_2$ |
| mTorr | 2.5–20 | 2.5–20 |
| flow rate of gas(es) (SCCM) | Ar 100 | Ar 100 O$_2$ 0–10 |
| substrate temperature | room temp. | room temp. |
| charged power density (W/cm$^2$) | 4 | 1 |
| distance between target and glass | 86 | 60 |

TABLE 2-continued

| Film Material | Cr | CoPt |
|---|---|---|
| substrate (mm) | | |

Thereafter, a protective film such as of carbon is formed on the magnetic film.

The magnetic recording mediums are fabricated under different sputtering conditions as shown in Table 2 wherein the atmospheric gas pressure and the flow rate are changed, and are then subjected to measurements of a content of oxygen in the magnetic film, a coercive force and the like.

Figure 4:
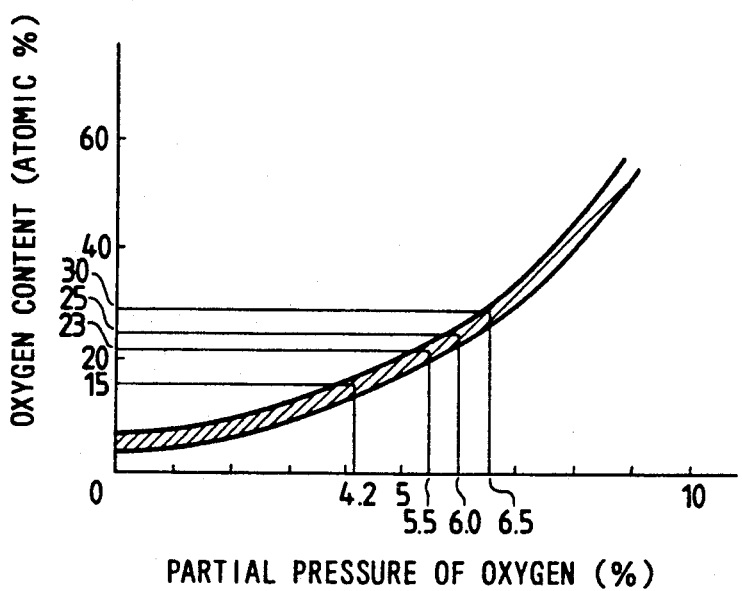
FIG. 4 is a graphical representation of the content of oxygen in a Co alloy film in relation to the variation in the partial pressure of oxygen in the atmosphere for sputtering.

The relation between the partial pressure of oxygen during the sputtering and the content of oxygen in the magnetic film is shown in FIG. 4. The oxygen content is varied within a shaded range in FIG. 4 at the same level of the partial pressure of oxygen.

Figure 5:
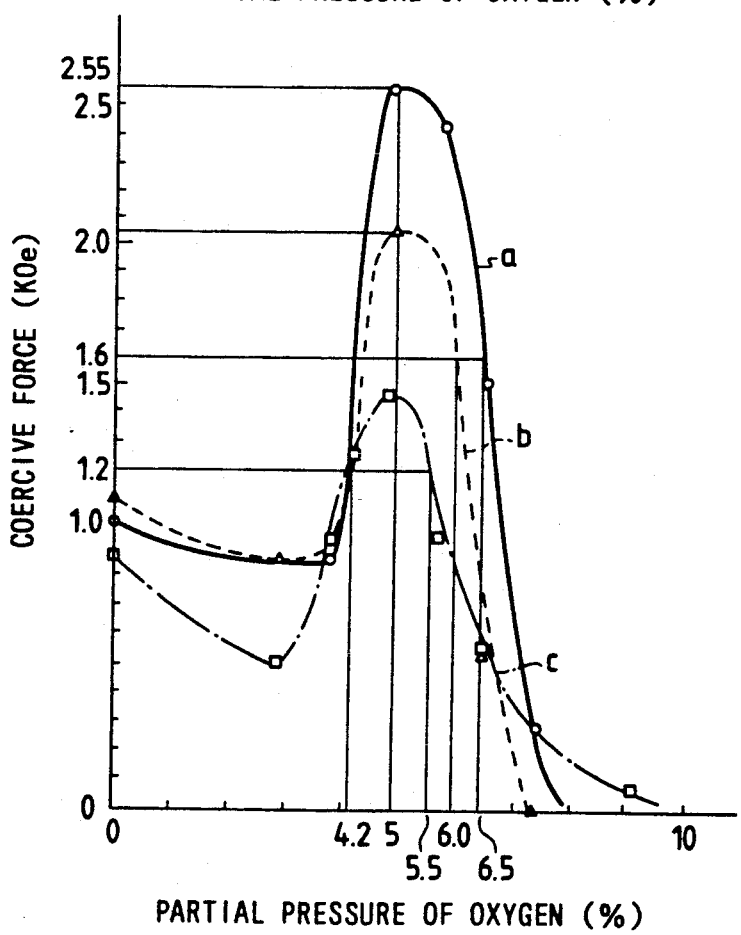
FIG. 5 is a graphical representation of the coercive force, Hc, of a Co alloy film in relation to the variation in the partial pressure of oxygen in the atmosphere for sputtering.

In FIG. 5, there is shown the coercive force in relation to the variation in the partial pressure of oxygen during the sputtering. In the figure, curve a is the variation in the coercive force at a gas pressure of 20 mTorr, curve b is the variation at a gas pressure of 10 mTorr. and curve c is the variation at a gas pressure of 5 mTorr.

The results shown in FIG. 5 are tabulated in Table 3 below along with coercive force values. From the figure and table, it will be seen that coercive force values higher than that of the oxygen-free film are obtained.

TABLE 3

| Gas Pressure (mTorr) | Partial Pressure of Oxygen (%) | Content of oxygen (atomic %) | Coercive Force (Hc) |
|---|---|---|---|
| 5 | 4.2–5.5 | 15–23 | 1200–1460 |
| 10 | 4.2–6.0 | 15–25 | 1200–2040 |
| 20 | 4.2–6.0 | 15–30 | 1200–2550 |

Figure 6:
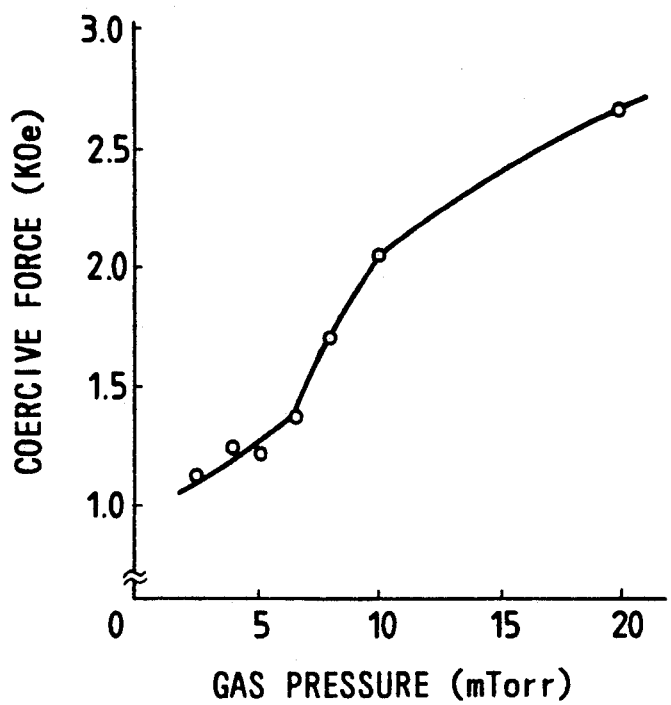
FIG. 6 is a graphical representation of the coercive force, Hc, in relation to the variation in the gas pressure during sputtering.

In FIG. 6, there is shown the relation between the coercive force and the pressure of the mixed gas during the sputtering wherein a partial pressure of oxygen is held at 5% and the Cr undercoat layer has a thickness of 0.2 μm. From the figure, it will be seen that the coercive force increases with the increase of the gas pressure.

It will be noted that when a CoPt film having the same composition as used above is sputtered without use of oxygen, the coercive force, Hc, is 880 Oe at a gas pressure of 5 mTorr, 1120 Oe at a gas pressure of 10 mTorr, and 1060 Oe at a gas pressure of 20 mTorr. As will be apparent from FIG. 5, the coercive force becomes maximum when the partial pressure of oxygen is 5% (corresponding to an oxygen content of about 20 atomic percent), and is 1460 Oe at a gas pressure of 5 mTorr, 2040 Oe at a gas pressure of 10 mTorr and 2550 Oe at a gas pressure of 20 mTorr. Thus, the improvement of the coercive force is very great.

This is more particularly described.

At a gas pressure of 5 mTorr, the coercive force is about 1200 Oe when the partial pressure of oxygen is 4.2% (corresponding to an oxygen content of 15 atomic percent) and gradually increases at a higher partial pressure of oxygen. When the film formation is effected in the vicinity of a partial pressure of oxygen of 5%, the coercive force becomes maximum at 1460 Oe. Over 5%, the coercive force gradually decreases and is kept at 1200 Oe up to a partial pressure of oxygen of approximately 5.5%.

At a gas pressure of 10 mTorr, the coercive force reaches about 1200 Oe when the film formation is effected at a partial pressure of oxygen of 4.2% (corresponding to an oxygen content of 15 atomic percent) and increases abruptly at a higher partial pressure. The maximum value is 2040 Oe at a partial pressure of oxygen of about 5%. Over 5%, the coercive force gradually decreases and is held at 1600 Oe up to a partial pressure of oxygen of about 6.0% (corresponding to an oxygen content of 25 atomic percent).

At a gas pressure of 20 mTorr, the coercive force is about 1200 Oe when the film formation is carried out at a partial pressure of oxygen of about 4.2% (corresponding to an oxygen content of 15%). It abruptly increases at a higher partial pressure and reaches a maximum value of 2550 Oe at a partial pressure of oxygen of about 5%. Over 5%, the coercive force gradually decreases but is held at 1600 Oe up to a partial pressure of 6.5% (corresponding to an oxygen content of 30%).

In view of the above, the oxygen content in the Co alloy thin film is in the range of from 15 to 30 atomic percent. For the fabrication of the magnetic recording medium, the Co alloy is sputtered in an atmosphere of a mixed gas of argon and oxygen at a total pressure of from 5 to 20 mTorr at a partial pressure of oxygen of from 4.2 to 6.5% based on the total pressure.

Figure 7:
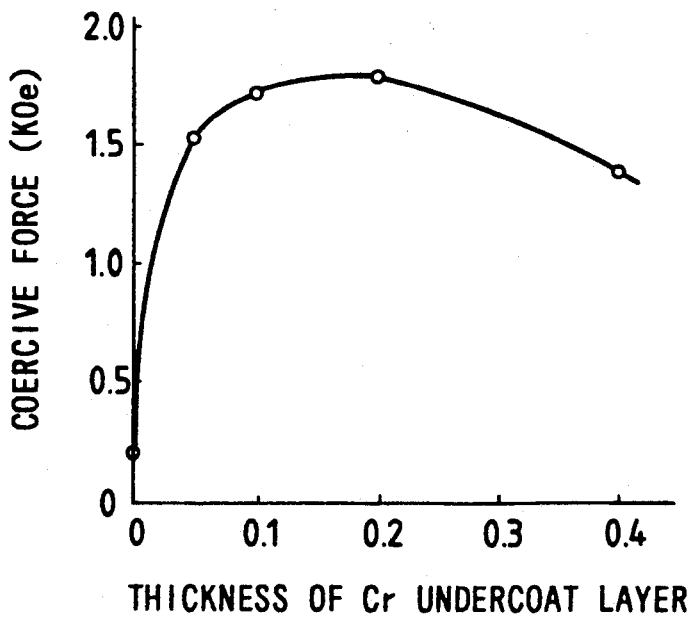
FIG. 7 is a graphical representation of the coercive force, Hc, in relation to the variation in the thickness of a Cr undercoat layer.

In order to check the role of the Cr undercoat layer, the coercive force is determined relative to the variation in the thickness of the Cr undercoat layer under conditions of a total gas pressure of 8 mTorr and a partially pressure of oxygen of 5%. The results are shown in FIG. 7.

From the figure, it will be seen that when no Cr undercoat layer is used, the coercive force is not larger than 400 Oe. When the thickness of the Cr undercoat layer increases, the coercive force, Hc, sharply increases and reaches a maximum value of about 1770 Oe at a thickness of the Cr undercoat layer of about 0.2 $\mu$m. The coercive force is held at a level of not less than 1400 Oe in a thickness range of from 0.05 to 0.4 $\mu$m. In order that the magnetic film of the magnetic recording medium according to this embodiment of the invention undergoes compositional segregation by incorporation of oxygen thereby causing crystals to grow as having a single magnetic domain structure, the Cr undercoat layer is essential. The Cr undercoat layer may be incorporated with oxygen as in the first embodiment, by which the coercive force will be further improved.

In the fabrication method according to the first and second embodiments, sputtering is used, so that starting materials are advantageously less consumed than those used in oblique vapor deposition techniques.

In the second embodiment, such substrate materials, sputtering conditions and Co alloys as used in the first embodiment may be likewise used.

What is claimed is:

1. A method for fabricating a magnetic recording medium which comprises forming a Cr undercoat layer on a substrate and further forming a Co alloy thin film on the undercoat layer by sputtering, wherein said undercoat layer is formed by sputtering in an atmosphere of a mixed gas of argon and oxygen at a total pressure of from 10 to 20 mTorr and at a partial pressure of oxygen of from 1 to 20% based on the total pressure whereby from 4 to 50 atomic percent of the oxygen is incorporated in the undercoat layer.

2. A method according to claim 1, wherein the partial pressure of oxygen is in the range of from 5 to 10% based on the total pressure.

* * * * *